US011929297B2

(12) United States Patent
Nayak et al.

(10) Patent No.: US 11,929,297 B2
(45) Date of Patent: Mar. 12, 2024

(54) CONDUCTIVE THERMAL MANAGEMENT ARCHITECTURE FOR ELECTRONIC DEVICES

(71) Applicant: Hamilton Sundstrand Corporation, Charlotte, NC (US)

(72) Inventors: Hebri Vijayendra Nayak, Rockford, IL (US); Scott C. Wohlfarth, Edgerton, WI (US); Michael Anthony Futrell, Rockford, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 618 days.

(21) Appl. No.: 17/092,542

(22) Filed: Nov. 9, 2020

(65) Prior Publication Data

US 2022/0148939 A1 May 12, 2022

(51) Int. Cl.
*H01L 23/367* (2006.01)
*H01L 23/00* (2006.01)
*H01L 23/31* (2006.01)
*H01L 23/40* (2006.01)
*H01L 23/495* (2006.01)
*H01L 23/498* (2006.01)

(52) U.S. Cl.
CPC ........ *H01L 23/367* (2013.01); *H01L 23/3107* (2013.01); *H01L 23/40* (2013.01); *H01L 23/49575* (2013.01); *H01L 23/49833* (2013.01); *H01L 24/97* (2013.01)

(58) Field of Classification Search
CPC ............ H01L 23/367; H01L 23/49575; H01L 23/49833; H01L 23/3107; H01L 24/40; H01L 24/97

See application file for complete search history.

(56) References Cited

U.S. PATENT DOCUMENTS 5,373,104 A * 12/1994 Brauer ................. H05K 7/1417
206/508
5,644,277 A * 7/1997 Gulick .................... H01L 23/66
257/E23.174

(Continued)

FOREIGN PATENT DOCUMENTS

CN 109920785 A 6/2019

OTHER PUBLICATIONS

Extended European Search Report for EP Application No. 21201934. 3, dated Apr. 4, 2022, pp. 1-11.

*Primary Examiner* — Alonzo Chambliss
(74) *Attorney, Agent, or Firm* — CANTOR COLBURN LLP (57) ABSTRACT

An electronic assembly includes a first printed wiring board (PWB) on a first side of the electronic assembly, and a first stiffener secured to the first PWB. The electronic assembly also includes a second PWB on a second side of the electronic assembly, opposite the first side, a second stiffener secured to the second PWB, and a center stiffener seated in the second stiffener and between the first stiffener and the second stiffener. The center stiffener has a first side facing the first stiffener, a second side that is opposite the first side and facing the second stiffener, a first end, and a second end, opposite the first end. Electronic devices are secured to the center stiffener. The center stiffener dissipates heat from the electronic devices, and the electronic devices include power dies.

18 Claims, 8 Drawing Sheets

(56) References Cited

U.S. PATENT DOCUMENTS

| | | | |
|---|---|---|---|
| 6,317,330 B1* | 11/2001 | Portman | H05K 7/1461 |
| | | | 439/74 |
| 7,800,224 B2 | 9/2010 | Lee et al. | |
| 9,078,357 B2* | 7/2015 | Gunderson | H05K 5/0269 |
| 10,141,254 B1 | 11/2018 | Xu et al. | |
| 2009/0093142 A1* | 4/2009 | Lin | H05K 7/1053 |
| | | | 439/66 |
| 2009/0107655 A1* | 4/2009 | Kajiura | H01L 23/473 |
| | | | 165/80.3 |
| 2010/0182529 A1* | 7/2010 | Nakanishi | H04M 1/22 |
| | | | 361/820 |
| 2012/0281364 A1* | 11/2012 | Gunderson | H05K 5/0269 |
| | | | 361/714 |
| 2013/0044434 A1* | 2/2013 | Sharaf | H05K 7/20927 |
| | | | 361/702 |
| 2016/0043017 A1 | 2/2016 | Jones et al. | |
| 2017/0064808 A1* | 3/2017 | Rizza | H01L 23/36 |
| 2017/0287875 A1* | 10/2017 | Gao | H01L 21/486 |
| 2021/0313107 A1* | 10/2021 | Nayak | H05K 1/181 |

\* cited by examiner

CONDUCTIVE THERMAL MANAGEMENT ARCHITECTURE FOR ELECTRONIC DEVICES

BACKGROUND

Exemplary embodiments pertain to the art of electronic devices and, in particular, to a conductive thermal management architecture for electronic devices.

Electronic devices, such as power dies and diodes, are used in a broad range of applications. When the installation of these devices facilitates exposure to the ambient atmosphere, convective heat transfer can be used to cool these heat-generating devices. However, based on the specific application, such exposure and, thus, the resultant convective heat transfer is not possible. In these cases, conductive thermal management must be employed.

BRIEF DESCRIPTION

In one embodiment, an electronic assembly includes a first printed wiring board (PWB) on a first side of the electronic assembly. The electronic assembly also includes a first stiffener secured to the first PWB, a second PWB on a second side of the electronic assembly, opposite the first side, a second stiffener secured to the second PWB, and a center stiffener seated in the second stiffener and between the first stiffener and the second stiffener. The center stiffener has a first side facing the first stiffener, a second side that is opposite the first side and facing the second stiffener, a first end, and a second end, opposite the first end. Electronic devices are secured to the center stiffener. The center stiffener dissipates heat from the electronic devices, and the electronic devices include power dies.

Additionally or alternatively, in this or other embodiments, the electronic assembly also includes wedge locks to secure the center stiffener between the first stiffener and the second stiffener based on compressive force, a first wedge lock mounting rail extending from the first end of the center stiffener to support a first set of the wedge locks, and a second wedge lock mounting rail extending from the second end of the center stiffener to support a second set of the wedge locks.

Additionally or alternatively, in this or other embodiments, the center stiffener transfers heat from the electronic devices on the first side and the second side and closer to the first end of the center stiffener to the first wedge lock mounting rail and transfers heat from the electronic devices on the first side and the second side and closer to the second end of the center stiffener to the second wedge lock mounting rail.

Additionally or alternatively, in this or other embodiments, the second stiffener includes wedge-shaped slots to accommodate the first end and the second end of the center stiffener.

Additionally or alternatively, in this or other embodiments, the electronic assembly also includes ceramic plates secured to the center stiffener, each ceramic plate is secured to the first side or the second side and closer to the first end or the second end of the center stiffener.

Additionally or alternatively, in this or other embodiments, the center stiffener is copper, the ceramic plates are silicon nitride or aluminum nitride and are secured to the center stiffener by a direct bonding of copper (DBC) technique.

Additionally or alternatively, in this or other embodiments, the electronic assembly also includes copper plates secured to the ceramic plates. The electronic devices are mounted on the copper plates.

Additionally or alternatively, in this or other embodiments, the copper plates are secured by the DBC technique to the ceramic plates and the electronic devices are soldered to the copper plates.

Additionally or alternatively, in this or other embodiments, the electronic devices include diodes, a first gate drive PWB is on the first side of the center stiffener, and a second gate drive PWB is on the second side of the center stiffener.

Additionally or alternatively, in this or other embodiments, the electronic assembly also includes spring-loaded electrical contacts held in holders on the first side and the second side of the center stiffener. The spring-loaded electrical contacts carry current between the first PWB and the power dies on the first side of the center stiffener and between the second PWB and the power dies on the second side of the center stiffener.

In another embodiment, a method of assembling an electronic assembly includes securing a first printed wiring board (PWB) on a first side of the electronic assembly, securing a first stiffener to the first PWB, securing a second PWB on a second side of the electronic assembly, opposite the first side, securing a second stiffener to the second PWB, and disposing a center stiffener in the second stiffener and between the first stiffener and the second stiffener. The center stiffener has a first side facing the first stiffener, a second side that is opposite the first side and facing the second stiffener, a first end, and a second end, opposite the first end. Electronic devices are secured to the center stiffener. The center stiffener dissipates heat from the electronic devices, and the electronic devices include power dies.

Additionally or alternatively, in this or other embodiments, the method also includes configuring wedge locks to secure the center stiffener between the first stiffener and the second stiffener based on compressive force. A first set of the wedge locks is supported by a first wedge lock mounting rail extending from the first end of the center stiffener, and a second set of the wedge locks is supported by a second wedge lock mounting rail extending from the second end of the center stiffener.

Additionally or alternatively, in this or other embodiments, the method also includes configuring the center stiffener to transfer heat from the electronic devices on the first side and the second side and closer to the first end of the center stiffener to the first wedge lock mounting rail and to transfer heat from the electronic devices on the first side and the second side and closer to the second end of the center stiffener to the second wedge lock mounting rail.

Additionally or alternatively, in this or other embodiments, the method also includes forming wedge-shaped slots in the second stiffener to accommodate the first end and the second end of the center stiffener.

Additionally or alternatively, in this or other embodiments, the method also includes securing ceramic plates to the center stiffener, each ceramic plate being secured to the first side or the second side and closer to the first end or the second end of the center stiffener.

Additionally or alternatively, in this or other embodiments, the method also includes fabricating the center stiffener from copper and the ceramic plates from silicon nitride or aluminum nitride and securing the ceramic plates to the center stiffener by a direct bonding of copper (DBC) technique.

Additionally or alternatively, in this or other embodiments, the method also includes securing copper plates to the ceramic plates and mounting the electronic devices on the copper plates.

Additionally or alternatively, in this or other embodiments, the securing the copper plates to the ceramic plates includes using the DBC technique and mounting the electronic devices includes soldering the electronic devices to the copper plates.

Additionally or alternatively, in this or other embodiments, the method also includes including a first gate drive PWB on the first side of the center stiffener and including a second gate drive PWB on the second side of the center stiffener.

Additionally or alternatively, in this or other embodiments, the method also includes including spring-loaded electrical contacts held in holders on the first side and the second side of the center stiffener, wherein the spring-loaded electrical contacts carry current between the first PWB and the power dies on the first side of the center stiffener and between the second PWB and the power dies on the second side of the center stiffener.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

As previously noted, electronic devices generate heat that could be dissipated via convective heat transfer if the devices were installed in such a way that they are exposed to airflow. In certain applications such as deep space applications, for example, high power density electronic devices (e.g., power dies and diodes) and other components are arranged within an assembly in such a way that convective heat transfer is not possible. Embodiments detailed herein relate to a conductive thermal management architecture for electronic devices. The electronic devices are power dies and diodes with gate drive electronics according to an exemplary embodiment. However, the conductive heat transfer facilitated by the architecture detailed herein is equally applicable to other electronic devices and modules that dissipate heat. Exemplary applications of these embodiments include deep space, underwater-based, and ground-based applications.

Figure 1A:
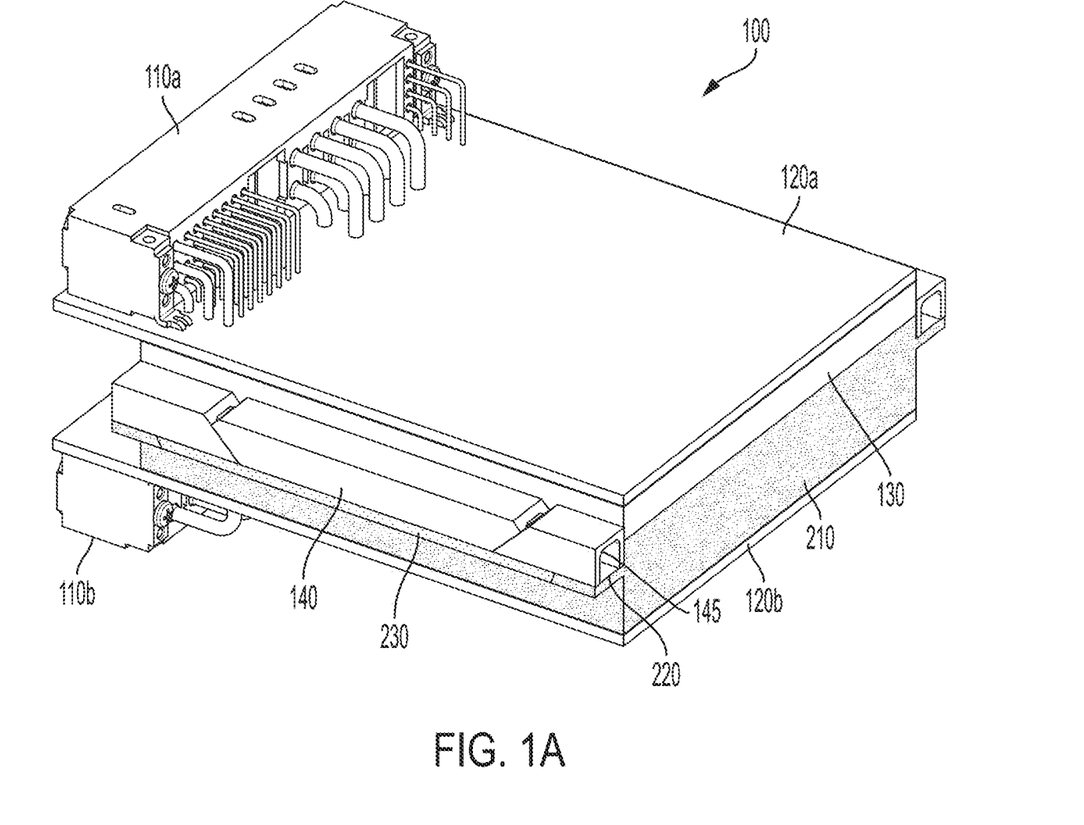
FIG. 1A is an isometric view of an exemplary electronic assembly that includes a conductive thermal management architecture according to one or more embodiments.
Figure 5A:
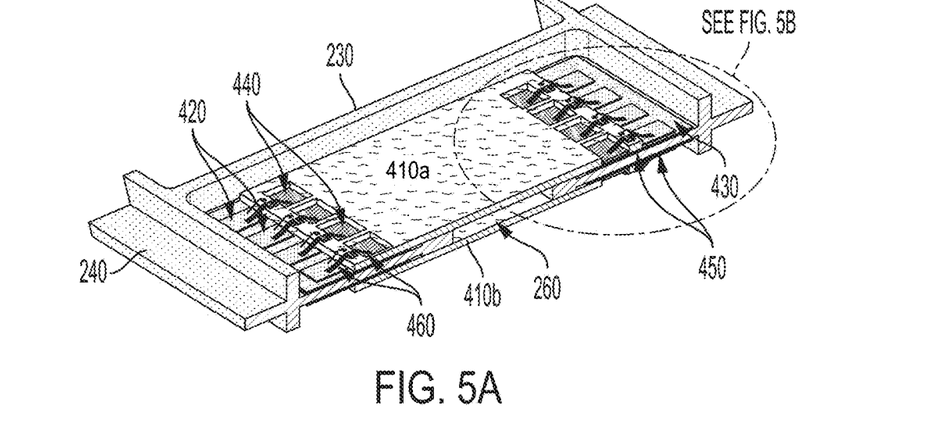
FIG. 5A is a cross-sectional view through A-A as indicated in FIG. 4.

FIG. 1A is an isometric view of an exemplary electronic assembly 100 that includes a conductive thermal management architecture according to one or more embodiments. A primary backplane connector 110a mounted on a primary printed wiring board (PWB) 120a and a secondary backplane connector 110b mounted on a secondary PWB 120b (generally referred to as a backplane connector 110 and PWB 120) are shown. Between the two PWBs 120 are an outer stiffener 210, a center stiffener 230, and an additional stiffener 130. The center stiffener 230 facilitates conductive heat transfer as further discussed with reference to FIG. 5, for example.

The outer stiffener 210 and additional stiffener 130 may be aluminum stiffeners while the center stiffener 230 may be copper. Wedge locks 140 are shown on either end of the electronic assembly 100, and an opening 145 for a wedge lock screw (not shown) is indicated. These may be used in securing the electronic assembly 100 to a rack, for example. The wedge locks 140 are supported by a wedge lock mounting rail 240 formed as part of the center stiffener 230 and by wedge lock mounting edges 220 formed as part of the outer stiffener 210. The wedge locks 140 may be aluminum, like the outer stiffener 210 and additional stiffener 130. For explanatory purposes, the two PWBs 120 are referred to as being on opposite sides while the wedge locks 140 are referred to as being on opposite ends.

Figure 1B:
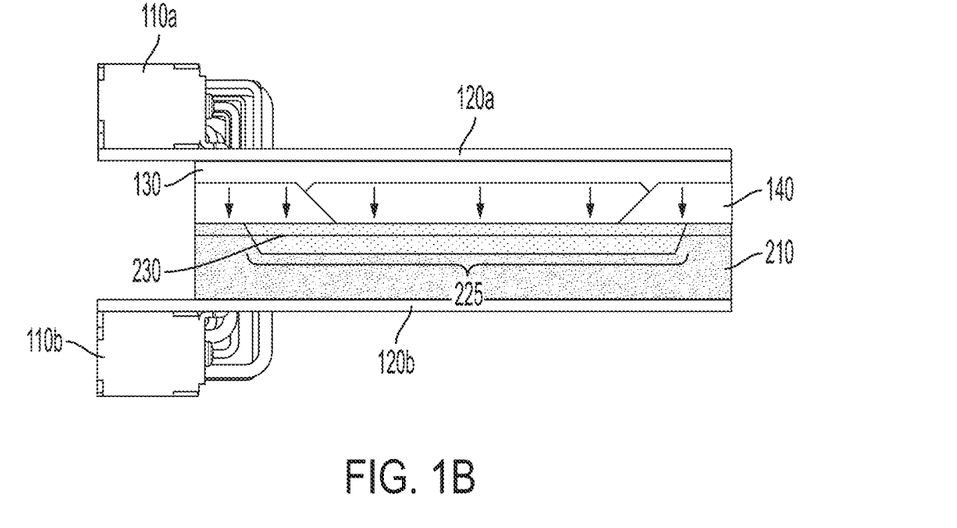
FIG. 1B is a side view of the exemplary electronic assembly that includes a conductive thermal management architecture according to one or more embodiments.

FIG. 1B is a side view of the exemplary electronic assembly 100 that includes a conductive thermal management architecture according to one or more embodiments. As previously noted, the wedge locks 140 facilitate the installation of the electronic assembly 100 into a chassis in an electronic box. Specifically, a wedge lock screw is inserted in the opening 145 of each wedge lock 140 and a torque is applied. The application of this torque results in the wedge locks 140 being subjected to both an axial force and a normal force (indicated by the arrows). The normal force, which is a compressive force, is transferred to the center stiffener 230 and the outer stiffener 210 at the wedge lock mounting rail 240 and wedge lock mounting edges 220. This compressive force ensures that the electronic assembly 100 is held firmly in a slot of the electronic box.

Figure 2:
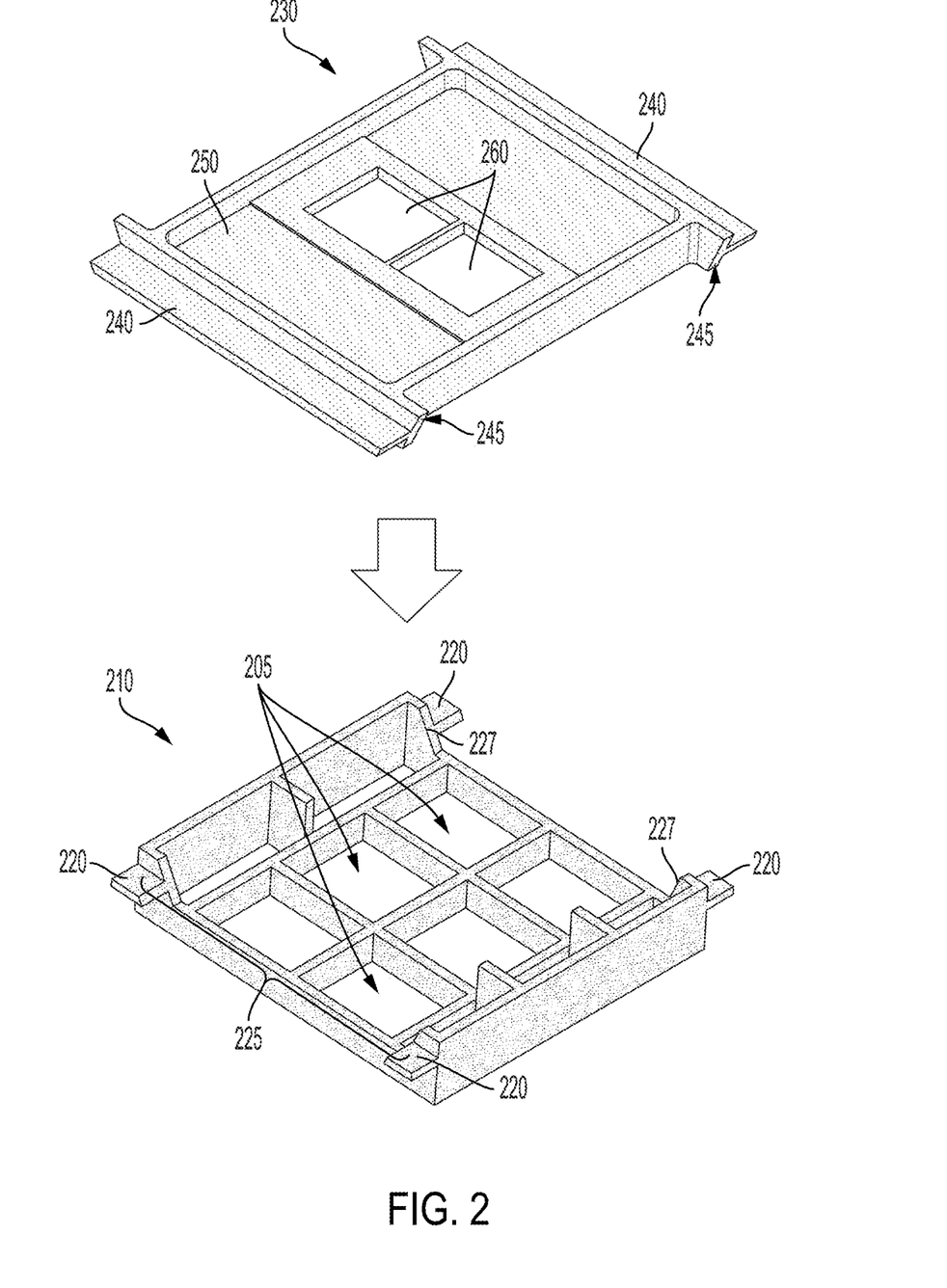
FIG. 2 is an exploded view of the center stiffener and the outer stiffener of the electronic assembly according to one or more embodiments.
Figure 4:
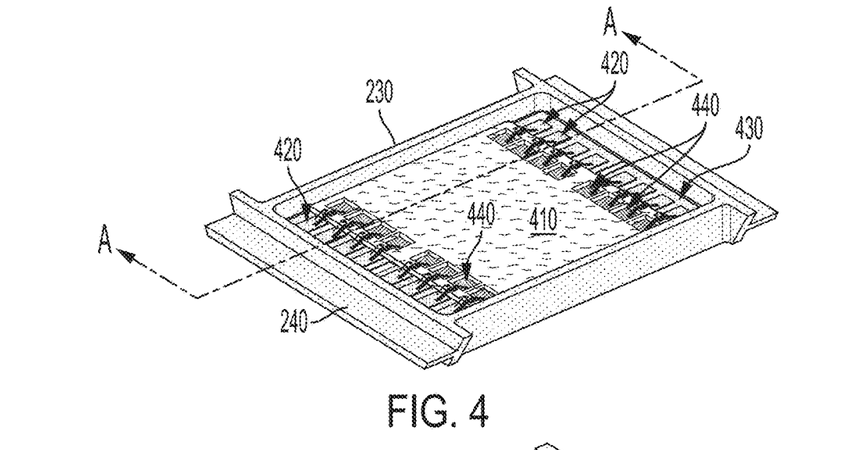
FIG. 4 shows one side of a center stiffener with electronic components according to exemplary embodiments.

FIG. 2 is an exploded view of the center stiffener 230 and the outer stiffener 210 of the electronic assembly 100 according to one or more embodiments. The center stiffener 230 has the wedge lock mounting rail 240 on each side. A tray 250 is formed on either end of openings 260, as shown. Electronic components are arranged in the trays 250, as shown in FIGS. 4 and 5, for example. The sloped edges 245 of the center stiffener 230 that fit in the wedge-shaped slots 225 of the outer stiffener 210 are indicated. The outer stiffener 210 is shown with two wedge lock mounting edges 220 on each end. On a given end, the two wedge lock mounting edges 220 are on either end of a wedge lock mounting rail 240 of the center stiffener 230. The sloped edges 227 that form the wedge-shaped slots 225 are indicated. The outer stiffener 210 is formed as a frame with openings 205, as indicated.

Figure 3A:
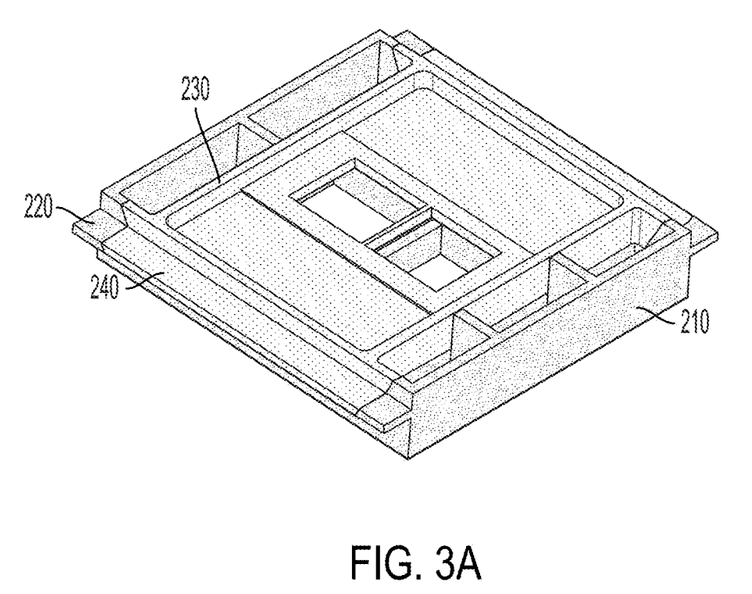
FIG. 3A is an isometric view showing the center stiffener in the outer stiffener.
Figure 3B:
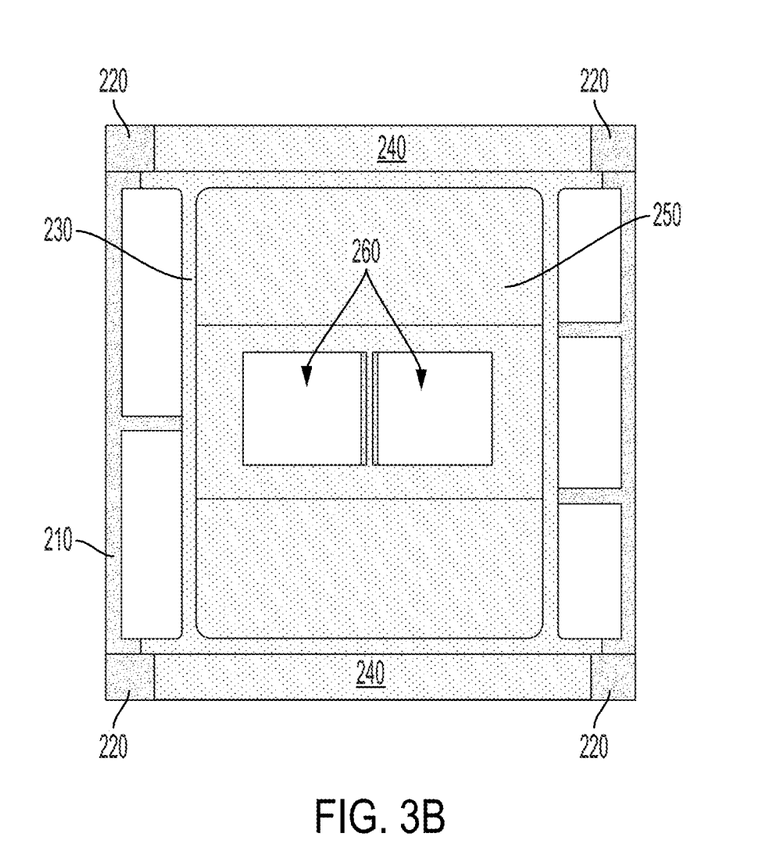
FIG. 3B is a top view of the center stiffener in the outer stiffener.
Figure 3C:
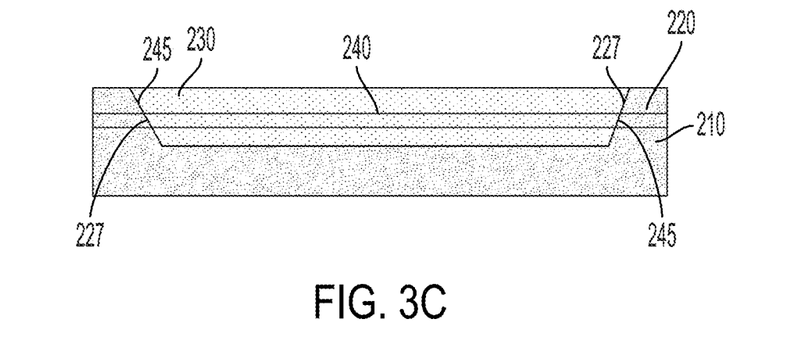
FIG. 3C is a side view of the center stiffener in the outer stiffener.

FIGS. 3A, 3B, and 3C show different views of the center stiffener 230 seated in the outer stiffener 210. FIG. 3A is an isometric view of the center stiffener 230 seated in the outer stiffener 210. FIG. 3B is a top view, and FIG. 3C is a side view of the center stiffener 230 in the outer stiffener 210. Although the opposite side of the center stiffener 230 is not visible, the trays 250 that accommodate electronic components are also on the opposite side, on either end of the openings 260. These trays 250 on the opposite side of the center stiffener 230 are mostly exposed due to the openings 205 in the outer stiffener 210, but each tray 250 is intersected by the frame of the outer stiffener 210.

As FIG. 3B makes clear, the wedge lock mounting rail 240 on either end of the center stiffener 230 fits between two wedge lock mounting edges 220 formed as part of the outer stiffener 210. As FIG. 3C shows, the sloped edges 245 of the center stiffener 230 align with the sloped edges 227 of the outer stiffener 210. The center stiffener 230 is not affixed or attached to the outer stiffener 210. Instead, as previously noted, the center stiffener 230 and the outer stiffener 210 are firmly held within the complete electronic assembly 100 based on the wedge locks 140. As such, components mounted on the center stiffener 230 are easily accessible. While the seating of the center stiffener 230 in the outer stiffener 210 is shown for explanatory purposes, the center stiffener 230 is actually seated in the outer stiffener 210 after components are mounted on the center stiffener 230, as shown in the remainder of the figures.

FIG. 4 shows one side of a center stiffener 230 with electronic components according to exemplary embodiments. A gate driver PWB 410 is shown along with power dies 420 and diodes 440 that are affixed (e.g., soldered) on a copper plate 430. The gate drive PWB 410 may include microcircuits and transformers, for example. The gate drive PWB 410 may provide low impedance drive signals to the power dies 420 and may also be used for signal conditioning. While the opposite side of the center stiffener 230 is not visible, the electronic components are mounted on both sides, as more clearly shown in FIG. 5.

Figure 5B:
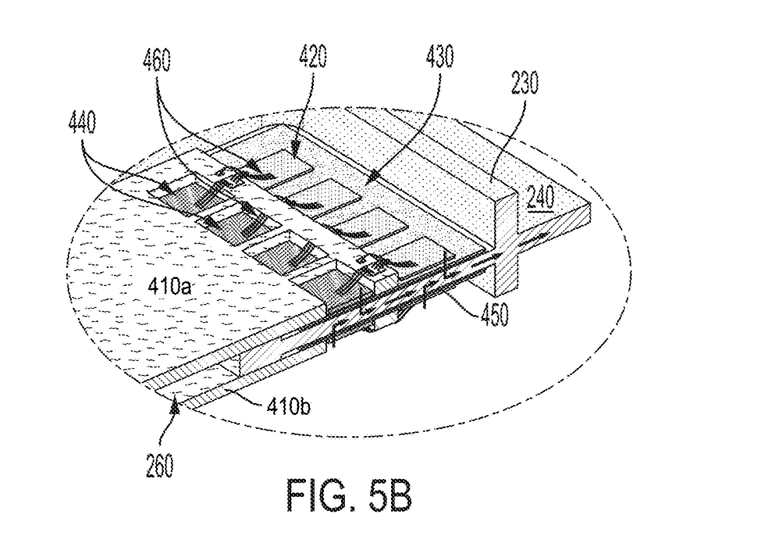
FIG. 5B is an expanded view of a portion of FIG. 5A.

FIG. 5A is a cross-sectional view through A-A as indicated in FIG. 4. In FIG. 5B, a portion of the cross-sectional view at one end is expanded. As indicated, the cross-section A-A is through an opening 260 rather than between openings 260. The cross-sectional view shows the gate drive PWB 410a on one side and the gate drive PWB 410b on the opposite side (generally referred to as gate drive PWB 410). The cross-sectional view also shows that the power dies 420 and diodes 440 are mounted on the copper plate 430 that is separated from the center stiffener 230 by a ceramic plate 450. The ceramic plate 450 may be silicon nitride or aluminum nitride, for example. Bond wires 460 extend from the power dies 420 and diodes 440 to the PWB 410. The power dies 420, diodes 440, and bond wires 460 are arranged in the trays 250 at both ends of both sides of the center stiffener 230.

The expanded view in FIG. 5B indicates the conductive heat transfer that occurs from the power dies 420 and diodes 440, from both sides of the center stiffener 230, through the center stiffener 230. As the arrows show, heat is ultimately transferred to the wedge lock mounting rail 240, which acts as a heat sink. The efficiency of this heat transfer benefits from the high thermal conductivity of the materials involved and the low thermal interface resistance of the interfaces involved. The thermal conductivity of the materials selected for the ceramic plate 450 (e.g., silicon nitride, aluminum nitride) and the center stiffener 230 (e.g., copper) is high in comparison with other materials that could be used. In addition, the copper plate 430 and the ceramic plate 450 that separate the heat sources (i.e., power dies 420 and diodes 440) from the center stiffener 230 are fabricated with a thickness indicated by the temperature requirement of the electronic assembly 100.

The interfaces between the heat sources and the center stiffener 230 include a first interface between the heat sources (i.e., power dies 420 and diodes 440) and the copper plate 430, a second interface between the copper plate 430 and the ceramic plate 450, and a third interface between the ceramic plate 450 and the center stiffener 230. Because the heat sources are soldered on the copper plate 430, the thermal interface resistance of the first interface (between these heat sources and the copper plate 430) is reduced. The copper plate 430 may be bonded to the ceramic plate 450 using a direct bonding of copper (DBC) technique. This decreases the thermal interface resistance at the second interface. The ceramic plate 450 may be bonded to the center stiffener 230, as well, using the DBC technique. Thus, the thermal interface resistance of the third interface is also decreased.

By selecting materials and using bonding techniques between the materials to increase thermal conductivity and decrease thermal interface resistance, heat dissipation from the heat sources is increased. As a result, junction temperature of the electronic devices that are the heat sources is maintained below the predefined maximum. This heat dissipation capability, based on the center stiffener 230, facilitates the use of the high power devices (i.e., power dies 420 and diodes 440). While one end of the center stiffener 230 is expanded, it should be clear that the heat transfer to the wedge lock mounting rail 240 occurs on both ends of the center stiffener 230.

Figure 6A:
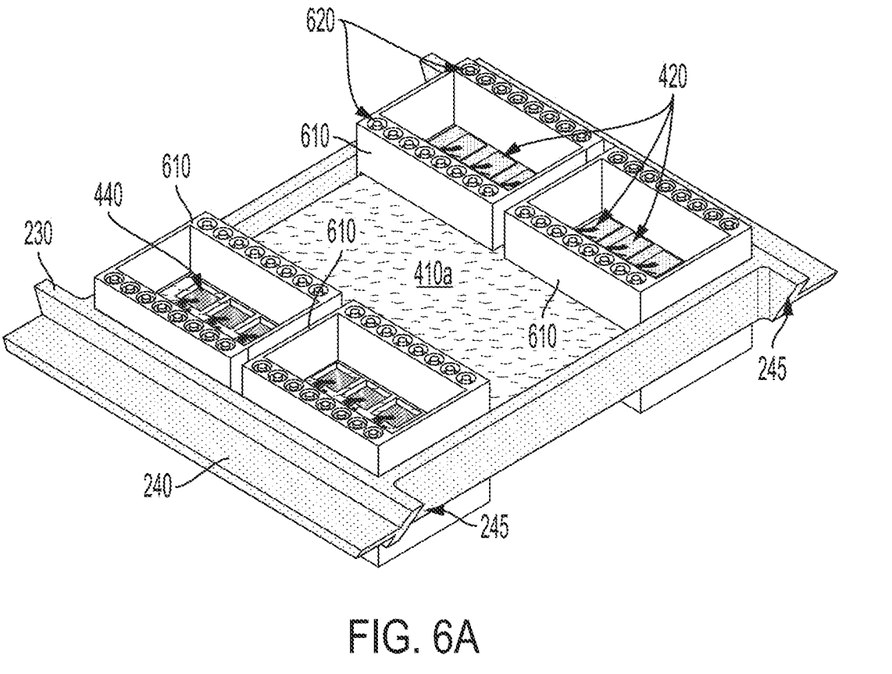
FIG. 6A is an isometric view of a first side of the center stiffener with spring-loaded electrical contacts added according to an exemplary embodiment.
Figure 6B:
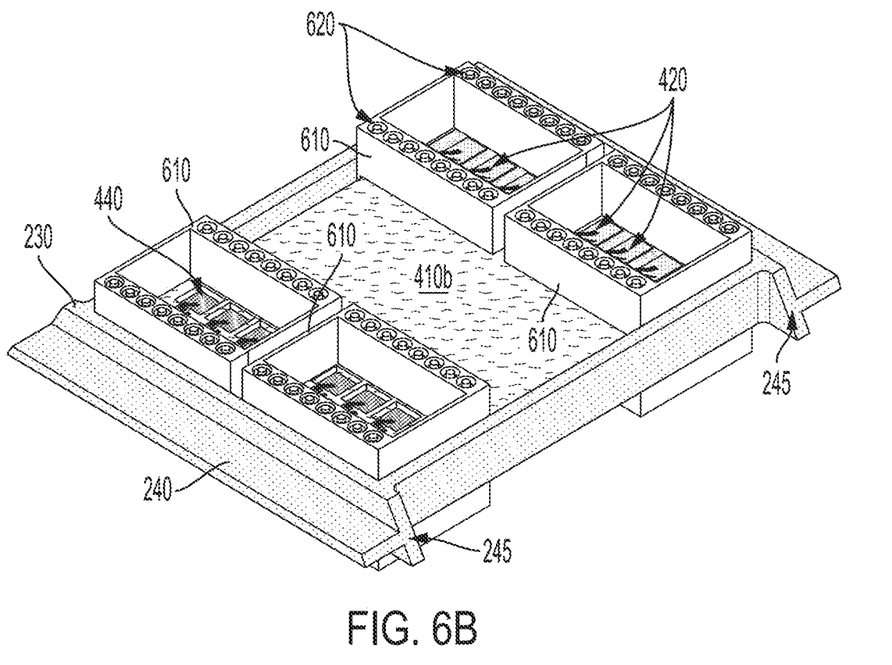
FIG. 6B is an isometric view of a second side of the center stiffener with spring-loaded electrical contacts added according to an exemplary embodiment.
Figure 6C:
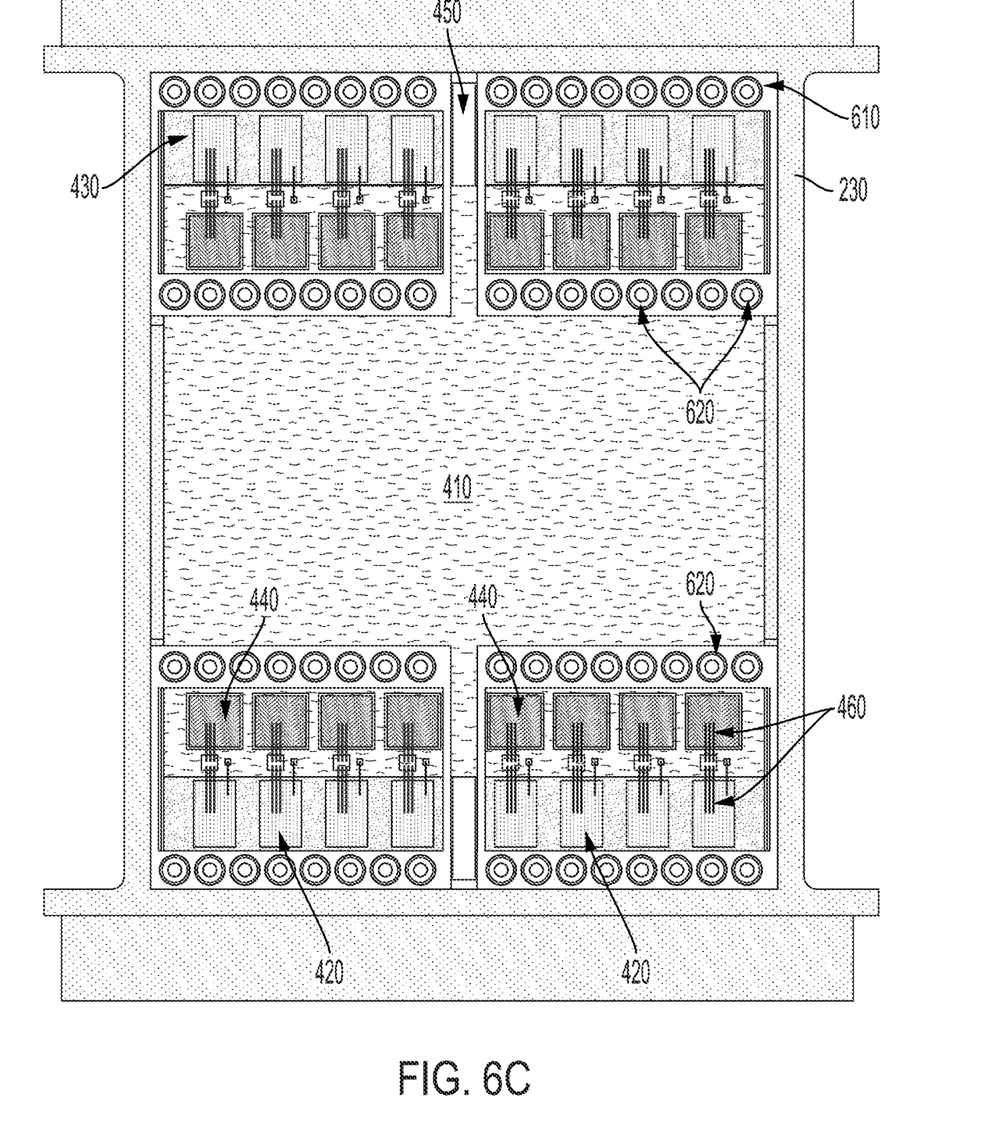
FIG. 6C is a top view of the center stiffener with spring-loaded electrical contacts added according to an exemplary embodiment.

FIGS. 6A, 6B, and 6C are different views of a result of adding spring-loaded electrical contacts 620 to the assembly shown in FIGS. 4, 5A, and 5B according to exemplary embodiments. FIGS. 6A and 6B are isometric views of opposite sides, and FIG. 6C is a top view. The sloped edges 245 in FIGS. 6A and 6B indicate that opposite sides are shown by each figure. Spring-loaded electrical contacts 620 are held in holders 610. Two spring-loaded electrical contacts 620 are shown above each tray 250 at each end of each side. That is, in the exemplary case, a total of eight holders 610 are used. The holder 610 is made of high-performance insulator materials. The spring-loaded electrical contacts 620 carry current between the primary and secondary PWBs 120 and the drain and source terminals of the power dies 420 on the corresponding side.

FIG. 6C clarifies that each holder 610 essentially frames a set of power dies 420 and diodes 440 mounted on a copper plate 430 and holds the spring-loaded electrical contacts 620 that supply the set of power dies 420. The ceramic plate 450 beneath the copper plates 430 associated with each set is visible between the sets. The numbers of power dies 420 and diodes 440, as well as the number of holders 610 and spring-loaded electrical contacts 620, are not limited by the exemplary illustrations. The electronic assembly 100 may be scaled and sized according to the number of devices needed by a given design.

Figure 7A:
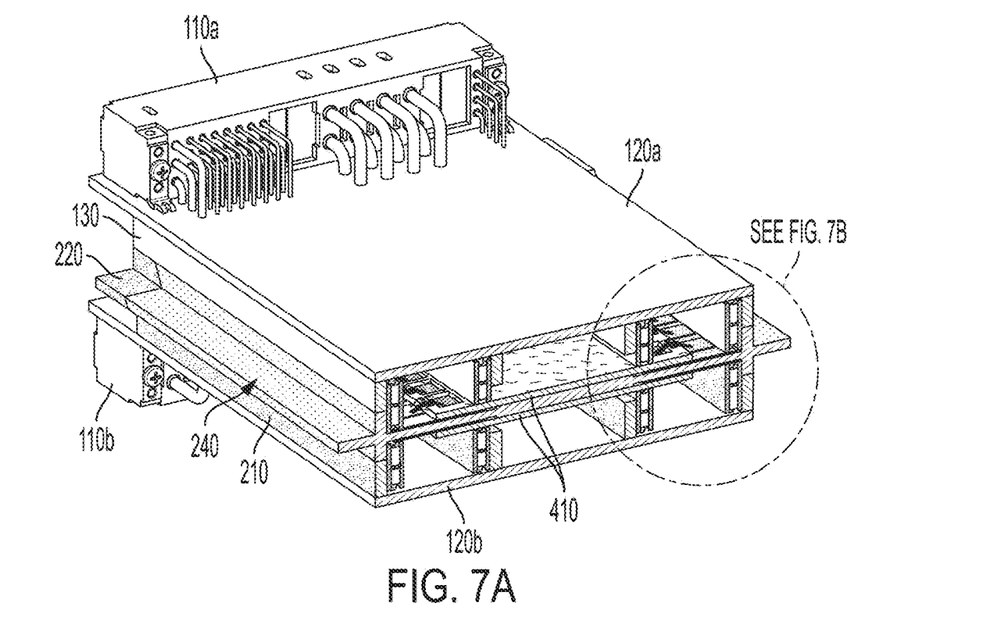
FIG. 7A is a cross-sectional isometric view of an exemplary electronic assembly according to one or more embodiments.
Figure 7B:
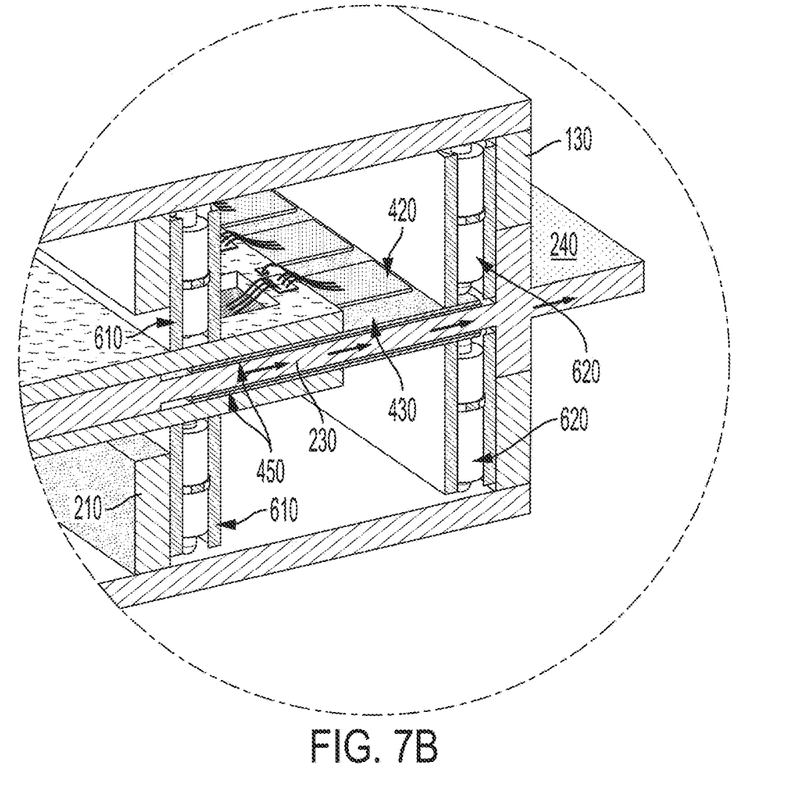
FIG. 7B is an expanded view of a portion of FIG. 7A.

FIG. 7A is a cross-sectional isometric view of an exemplary electronic assembly 100 according to one or more embodiments. An expanded view of one end is shown in FIG. 7B. The cross-sectional view is from end-to-end through the center stiffener 230. As such, one of the two wedge lock mounting edges 220 on each end, as well as one of the sloped edges 245 on each end, is not visible. The cross-sectional view shows the outer stiffener 210 on one side of the center stiffener 230. As previously noted, components (e.g., ceramic plate 450, copper plate 430, power dies 420, diodes 440, bond wires 460, holders 610, spring-loaded electrical contacts 620) are mounted on both sides of the center stiffener 230 and then the center stiffener 230 is seated in the outer stiffener 210. The additional stiffener 130 is then added, followed by the PWBs 120 and backplane connectors 110.

The outer stiffener 210 is secured to one of the PWBs 120 (e.g., the secondary PWB 120b according to the view in FIGS. 1A and 1B), and the additional stiffener is secured to the other PWB 120 (e.g., the primary PWB 120a according to the view in FIGS. 1A and 1B). The center stiffener 230 facilitates heat transfer from the electronic components mounted on both sides to the wedge lock mounting rails 240 on both ends. As FIGS. 7A and 7B show, the center stiffener 230 is between the outer stiffener 210 and the additional stiffener 130.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An electronic assembly comprising:
   a first printed wiring board (PWB) on a first side of the electronic assembly;
   a first stiffener secured to the first PWB;
   a second PWB on a second side of the electronic assembly, opposite the first side;
   a second stiffener secured to the second PWB;
   a center stiffener seated in the second stiffener and between the first stiffener and the second stiffener, wherein the center stiffener has a first side facing the first stiffener, a second side that is opposite the first side and facing the second stiffener, a first end, and a second end, opposite the first end;
   electronic devices secured to the center stiffener, wherein the center stiffener dissipates heat from the electronic devices, and the electronic devices include power dies; and
   comprising wedge locks configured to secure the center stiffener between the first stiffener and the second stiffener based on compressive force, a first wedge lock mounting rail extending from the first end of the center stiffener configured to support a first set of the wedge locks, and a second wedge lock mounting rail extending from the second end of the center stiffener configured to support a second set of the wedge locks.

2. The electronic assembly according to claim 1, wherein the center stiffener is configured to transfer heat from the electronic devices on the first side and the second side and closer to the first end of the center stiffener to the first wedge lock mounting rail and is configured to transfer heat from the electronic devices on the first side and the second side and closer to the second end of the center stiffener to the second wedge lock mounting rail.

3. The electronic assembly according to claim 1, wherein the second stiffener includes wedge-shaped slots configured to accommodate the first end and the second end of the center stiffener.

4. An electronic assembly comprising:
   a first printed wiring board (PWB) on a first side of the electronic assembly;
   a first stiffener secured to the first PWB;
   a second PWB on a second side of the electronic assembly, opposite the first side;
   a second stiffener secured to the second PWB;
   a center stiffener seated in the second stiffener and between the first stiffener and the second stiffener, wherein the center stiffener has a first side facing the first stiffener, a second side that is opposite the first side and facing the second stiffener, a first end, and a second end, opposite the first end;
   electronic devices secured to the center stiffener, wherein the center stiffener dissipates heat from the electronic devices, and the electronic devices include power dies; and
   ceramic plates secured to the center stiffener, each ceramic plate secured to the first side or the second side and closer to the first end or the second end of the center stiffener.

5. The electronic assembly according to claim 4, wherein the center stiffener is copper, the ceramic plates are silicon nitride or aluminum nitride and are secured to the center stiffener by a direct bonding of copper (DBC) technique.

6. The electronic assembly according to claim 5, further comprising copper plates secured to the ceramic plates, wherein the electronic devices are mounted on the copper plates.

7. The electronic assembly according to claim 6, wherein the copper plates are secured by the DBC technique to the ceramic plates and the electronic devices are soldered to the copper plates.

8. An electronic assembly comprising:
   a first printed wiring board (PWB) on a first side of the electronic assembly;
   a first stiffener secured to the first PWB;
   a second PWB on a second side of the electronic assembly, opposite the first side;
   a second stiffener secured to the second PWB;
   a center stiffener seated in the second stiffener and between the first stiffener and the second stiffener, wherein the center stiffener has a first side facing the first stiffener, a second side that is opposite the first side and facing the second stiffener, a first end, and a second end, opposite the first end;

electronic devices secured to the center stiffener, wherein the center stiffener dissipates heat from the electronic devices, and the electronic devices include power dies; and wherein the electronic devices include diodes, a first gate drive PWB is on the first side of the center stiffener, and a second gate drive PWB is on the second side of the center stiffener.

9. The electronic assembly according to claim 8, further comprising spring-loaded electrical contacts held in holders on the first side and the second side of the center stiffener, wherein the spring-loaded electrical contacts carry current between the first PWB and the power dies on the first side of the center stiffener and between the second PWB and the power dies on the second side of the center stiffener.

10. A method of assembling an electronic assembly, the method comprising:

securing a first printed wiring board (PWB) on a first side of the electronic assembly;

securing a first stiffener to the first PWB;

securing a second PWB on a second side of the electronic assembly, opposite the first side;

securing a second stiffener to the second PWB;

disposing a center stiffener in the second stiffener and between the first stiffener and the second stiffener, wherein the center stiffener has a first side facing the first stiffener, a second side that is opposite the first side and facing the second stiffener, a first end, and a second end, opposite the first end; and securing electronic devices to the center stiffener, wherein the center stiffener dissipates heat from the electronic devices, and the electronic devices include power dies and configuring wedge locks to secure the center stiffener between the first stiffener and the second stiffener based on compressive force, wherein a first set of the wedge locks is supported by a first wedge lock mounting rail extending from the first end of the center stiffener, and a second set of the wedge locks is supported by a second wedge lock mounting rail extending from the second end of the center stiffener.

11. The method according to claim 10, further comprising configuring the center stiffener to transfer heat from the electronic devices on the first side and the second side and closer to the first end of the center stiffener to the first wedge lock mounting rail and to transfer heat from the electronic devices on the first side and the second side and closer to the second end of the center stiffener to the second wedge lock mounting rail.

12. The method according to claim 10, further comprising forming wedge-shaped slots in the second stiffener to accommodate the first end and the second end of the center stiffener.

13. A method of assembling an electronic assembly, the method comprising:

securing a first printed wiring board (PWB) on a first side of the electronic assembly;

securing a first stiffener to the first PWB;

securing a second PWB on a second side of the electronic assembly, opposite the first side;

securing a second stiffener to the second PWB;

disposing a center stiffener in the second stiffener and between the first stiffener and the second stiffener, wherein the center stiffener has a first side facing the first stiffener, a second side that is opposite the first side and facing the second stiffener, a first end, and a second end, opposite the first end; and securing ceramic plates to the center stiffener, each ceramic plate being secured to the first side or the second side and closer to the first end or the second end of the center stiffener.

14. The method according to claim 13, further comprising fabricating the center stiffener from copper and the ceramic plates from silicon nitride or aluminum nitride and securing the ceramic plates to the center stiffener by a direct bonding of copper (DBC) technique.

15. The method according to claim 14, further comprising securing copper plates to the ceramic plates and mounting the electronic devices on the copper plates.

16. The method according to claim 15, wherein the securing the copper plates to the ceramic plates includes using the DBC technique and mounting the electronic devices includes soldering the electronic devices to the copper plates.

17. A method of assembling an electronic assembly, the method comprising:

securing a first printed wiring board (PWB) on a first side of the electronic assembly;

securing a first stiffener to the first PWB;

securing a second PWB on a second side of the electronic assembly, opposite the first side;

securing a second stiffener to the second PWB;

disposing a center stiffener in the second stiffener and between the first stiffener and the second stiffener, wherein the center stiffener has a first side facing the first stiffener, a second side that is opposite the first side and facing the second stiffener, a first end, and a second end, opposite the first end;

including a first gate drive PWB on the first side of the center stiffener; and including a second gate drive PWB on the second side of the center stiffener.

18. The method according to claim 17, further comprising including spring-loaded electrical contacts held in holders on the first side and the second side of the center stiffener, wherein the spring-loaded electrical contacts carry current between the first PWB and the power dies on the first side of the center stiffener and between the second PWB and the power dies on the second side of the center stiffener.

* * * * *